United States Patent [19]

Vogeli

[11] Patent Number: 5,554,229
[45] Date of Patent: Sep. 10, 1996

[54] LIGHT DIRECTING ELEMENT FOR PHOTOVOLTAIC DEVICE AND METHOD OF MANUFACTURE

[75] Inventor: Craig N. Vogeli, New Baltimore, Mich.

[73] Assignee: United Solar Systems Corporation, Troy, Mich.

[21] Appl. No.: 391,773

[22] Filed: Feb. 21, 1995

[51] Int. Cl.$^6$ .......................... H01L 31/04; H01L 31/18
[52] U.S. Cl. ...................... 136/259; 136/256; 257/436; 257/459; 437/2; 437/211
[58] Field of Search ................................ 136/256, 259; 257/436, 459; 437/2–5, 211–213

[56] References Cited

U.S. PATENT DOCUMENTS

| | | | |
|---|---|---|---|
| 4,260,429 | 4/1981 | Moyer | 136/256 |
| 4,379,202 | 4/1983 | Chalmers | 136/256 |
| 4,453,030 | 6/1984 | David et al. | 136/256 |
| 4,612,410 | 9/1986 | Hewig et al. | 136/256 |
| 5,076,857 | 12/1991 | Nowlan | 136/256 |

Primary Examiner—Aaron Weisstuch
Attorney, Agent, or Firm—Gifford, Krass, Groh, Sprinkle, Patmore, Anderson & Citkowski, P.C.

[57] ABSTRACT

A light directing element for a photovoltaic device and method of manufacture. The light directing element is in the form of an encapsulating cover which fits onto the top of the underlying photovoltaic cell. A bottom surface of the encapsulating cover is provided with V-shaped grooves which are in registry with the underlying grid lines of the photovoltaic cell. Preferably, the side walls of the grooves are coated with a reflective coating. Incident light, falling on the reflective side walls will be reflected onto adjacent portions of the photovoltaic cell, thereby minimizing shading effects caused by the grid lines. In a particularly preferred embodiment, each groove in the cover is filled with a conductive carbon paste, and conductive wires are embedded therein. This conductive wires serve as the current collecting network of the solar cell and are in electrical communication with the top electrode thereof by means of the conductive carbon paste. This embodiment has the desirable combination of decreased shading, and lower electrical resistance of the current collecting network.

8 Claims, 2 Drawing Sheets

LIGHT DIRECTING ELEMENT FOR PHOTOVOLTAIC DEVICE AND METHOD OF MANUFACTURE

FIELD OF THE INVENTION

This invention relates generally to photovoltaic devices. More specifically, the invention relates to photovoltaic devices with increased efficiency resultant from the minimization of shading effects caused by current-collecting grids.

BACKGROUND OF THE INVENTION

Photovoltaic energy is becoming a very significant power source for several reasons. Fossil fuels are becoming scarcer, and hence more expensive, every day. Furthermore, the burning of fossil fuels releases pollutants, including greenhouse gases which contribute to problems of global warming. Also, recent events have raised questions as to the safety and cost-effectiveness of nuclear power. For these reasons, traditional energy sources have become far less attractive. Photovoltaic energy, on the other hand, is inherently non-polluting, safe and silent. In addition, recent advances in photovoltaic technology have significantly increased the efficiency, and decreased the cost, of such device.

For example, it is now possible to manufacture large area silicon and/or germanium alloy materials which manifest electrical, optical, chemical, and physical properties equivalent, and in many instances superior to, their single crystalline counterparts. Layers of such alloys can be economically deposited at high speed over relatively large areas and in a variety of stacked configurations. Such alloys readily lend themselves to the manufacture of low cost photovoltaic devices. Examples of particular fluorinated semiconductor alloy materials having significant utility in fabrication of photovoltaic devices are described in U.S. Pat. No. 4,226,898 and U.S. Pat. No. 4,217,374, both invented by Ovshinsky et al, the disclosures of which are incorporated herein by reference.

In a typical large area photovoltaic device, a number of current-collecting structures are employed to convey photo-generated current to a terminal or other collection point. As used herein, these various structures will be referred to as "current-collecting grids" or "grid lines," these terms being understood to include both grids and bus bars as well as any other opaque conductors associated with the light incident side of photovoltaic devices. Use of current-collecting grids is necessary to withdraw power from the photovoltaic device; however, these grids are typically made of high electrical conductivity material such as deposited metal patterns, adhesively adhered metal tapes, metal-containing pastes, metallic inks or plated layers and are quite opaque. The grid lines shade underlying portions of the photovoltaic device thereby preventing it from generating power. Clearly, the grid lines are needed to allow for the efficient withdrawal of photo-generated current, but their presence also detracts from the overall efficiency of the cell. The lines can be made smaller; however, this increases their electrical resistance and thereby tends to decrease cell efficiency. Under the constraints of the prior art, a designer of photovoltaic devices is caught in a dilemma of having to balance the electrical resistance of the cell versus the amount of active area presented for illumination.

In some instances, prior art cells relied upon the use of relatively thin deposits of high conductivity metals such as pure gold, silver, or copper to provide high conductivity, relatively small area grid lines. However, such approaches require the use of sophisticated photolithographic techniques for patterning the grid lines. Additionally, the length of such thin grid lines was limited by the need to avoid high resistivity; consequently, this approach is limited in size and is quite expensive. Lower cost, easier to apply grid lines prepared from paste or ink material are quite desirable; however, they are of lower conductivity and hence must be made fairly thick and wide to achieve sufficient current carrying capabilities. Such materials were not heretofore practical since the grid lines they provide create a high level of shading. What is needed is a method and structure which permits the use of relatively wide grid line patterns, while minimizing shading from those grid lines.

Various attempts have been implemented in the prior art to employ optical systems to concentrate light in areas remote from grid lines. Such approaches involve the use of prismatic arrays and the like. These arrays are typically supported in a spaced-apart relationship with the photovoltaic device or they are adhesively affixed to the light incident side of the device and, when properly aligned, redirect light falling in the region of grid lines to grid-free portions of the device. This technology is typically employed in conjunction with concentrator cells. An overview of this technology is presented by Zhao et al in a paper entitled "Improvements in Silicon Concentrator Cells," published in the Proceedings of the 4th International Photovoltaic Science and Engineering Conference, Sydney, Australia, Feb. 14–17, 1989, Vol. 2, p. 581. Use of a Fresnel, lenticular concentrator is also disclosed in U.S. Pat. No. 4,711,972. The use of grooved top covers is also disclosed in U.S. Pat. Nos. 4,379,202 and 4,453,030. Moreover, the '202 patent discloses an embodiment with the grooves formed in a bottom face of the cover (FIGS. 6 & 7). However, the disclosure cautions that the grooves must define volumes having a lower index of refraction than does the cover.

U.S. Pat. No. 5,110,370 discloses a photovoltaic cell and method of manufacture, the cell including a light directing optical element integrally formed on the top surface of an encapsulant layer in the region of opaque, current-collecting grid lines. The optical elements consist of V-shaped grooves formed in the top surface of the encapsulant layer (preferably by embossing with a die). The geometry of the grooves redirects incident light falling thereon onto adjacent regions of the cell, thereby decreasing the shading affects described above.

The aforementioned patent discloses grid lines which are preferably fabricated from an electrically-conductive ink or paste or of a metallic body adhered to the top electrode layer. In some instances, however, it would be useful to form the grid lines of electrically conductive wire, which would provide good electrical conductivity and low resistance at a low cost. However, the geometry of cylindrical wire tends to exacerbate the shading problems noted above; in addition it is difficult to achieve good electrical contact between the wire and the top electrode since only a very small portion of the cylindrical surface of the wire actually contacts the electrode. Clearly, it would be advantageous to provide a device which utilizes conductive wire as the electrically conductive grid line, yet which also minimizes the shading problems otherwise caused by such wire.

It would also be desirable to provide a photovoltaic cell which takes full advantage of the optical properties of reflective surfaces to minimize the efficiency losses caused by the grid line structure, yet does not require filling in grooves with a low refractive index encapsulant.

SUMMARY OF THE INVENTION

Disclosed and claimed herein is a light directing element for a photovoltaic device designed to decrease shading from the collector grid lines. The cover has a V-shaped groove formed in its bottom surface where the cover interfaces with the top electrode of a photovoltaic cell. The V-shaped groove extends for a distance up into the cover which, preferably, is fabricated from a transparent, electrically insulating, synthetic organic, polymeric material. The V-shaped groove has sloping side walls and is in registry with a grid line disposed on the top electrode of the photovoltaic cell which the cover overlies. Thus, the side walls of the V-shaped groove will serve to reflect incident light falling thereon onto adjacent portions of the photo cell and minimizes shading effects. To enhance their reflectivity, the groove side walls may have a reflective, silvered layer coated thereon.

Of course, typical photovoltaic cells include a plurality of grid lines as part of the current collecting network. Thus, the light directing element of the present invention preferably includes a plurality of grooves, one of which is in registry with each of the grid lines disposed on the top electrode of the underlying photovoltaic cell. Since these grid lines are, typically, arrayed in spaced and parallel fashion, the V-shaped grooves of the light directing element of the present invention will be arrayed in similar spaced and parallel fashion and will include a plurality of ungrooved lands interspaced between adjacent pairs of grooves. Thus, the lands will be in registry with those portions of the photovoltaic cell which are not covered by grid lines. Thus, incident light falling upon the uncovered lands will pass directly onto the unshaded portions of the solar cell; furthermore, incident light falling on the side walls of the V-shaped grooves will be reflected onto the ungrooved lands and, again, will pass through to the unshaded portions of the solar cell, thus minimizing shading effects.

In a preferred embodiment of the light directly element of the present invention, it is fabricated to include a current conducting wire disposed in each V-shaped groove which, preferably, is surrounded and supported by a filler material such as an electrically conductive paste. In this embodiment, the plurality of wires disposed in the grooves actually serve as the grid lines of the solar cell; electrical contact between the top electrode thereof and the conductive wires is maintained by the electrically conductive filler material which surrounds and supports the wires and, optionally, a small underlying strip of conductive material disposed on the top surface of the top electrode. This embodiment combines the advantages of lower electrical resistance characteristic of electrically conductive wire versus embossed or metallic strip grid lines with the decreased shading effect described above due to the sloping side walls of the grooves disposed on the bottom of the cover of the photovoltaic cell. This embodiment may also include a reflective coating applied to the side walls to further enhance the reflectivity of the side walls, thus further maximizing energy efficiency.

Unlike the encapsulant layers disclosed in U.S. Pat. No. 5,110,370, which includes grooves embossed or otherwise applied to the top surface thereof, the light directing element of the present invention is separately fabricated and then attached to the underlying photovoltaic cell, preferably by means of a coat of adhesive disposed on either the top surface of the top electrode or the bottom surface of the grooved cover. Typically, the cover is fabricated as a sheet or film of the polymeric material, and what is to become the bottom surface thereof is then grooved by means such as a heated embossing die, in a manner known in the prior art. Thus, depending on the application, the cover may be made flexible for use with flexible, amorphous silicon photo cells, or rigid for use with single crystal type cells. Of course, other means may be used to form the grooved cover, such as, for example, extrusion molding, etc., may be employed.

BRIEF DESCRIPTION OF THE DRAWINGS

The following detailed description is best understood by reference to the following drawings, in which.

DETAILED DESCRIPTION OF THE INVENTION

Figure 1:
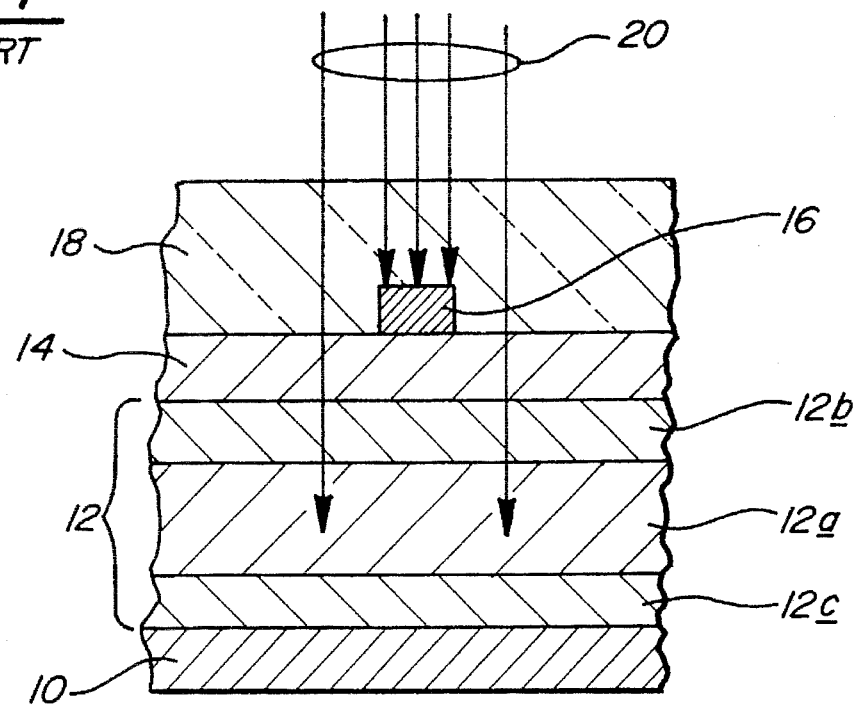
FIG. 1 is a cross-sectional view of a portion of a photovoltaic cell of the prior art illustrating the problem of grid line shading.

Referring now to FIG. 1, there is shown a cross-sectional view of a portion of a photovoltaic cell of the prior art illustrating the problem of grid line shading. The cell includes a substrate 10, which in this instance is a metallic substrate which also functions as a bottom electrode layer. Disposed immediately atop the electrically-conductive substrate 10 is a body of photovoltaic material 12 and immediately thereatop on the light incident side of the photovoltaic body 12, is a top electrode layer 14. The top electrode layer 14 is most preferably fabricated from a transparent material so as to permit passage of light therethrough. Associated with the top electrode layer 14 is a grid line 16 which operates to collect current from the top electrode layer 14 and carry it to a bus bar or other terminal. The top, i.e., light incident, surface of the photovoltaic device is protected by a layer of transparent, encapsulant material 18.

There are a great variety of materials which may be utilized to manufacture the photovoltaic devices useful with the present invention. The bottom electrode layer is fabricated from an electrically-conductive material and as noted hereinabove, may also function as a support substrate for the device. Toward that end, one preferred material is stainless steel of approximately 8 mils thickness. Other substrates include electrically-insulating materials such as polymeric bodies, glass, or ceramics and, in such instances, the electrode layer will be deposited thereatop. The photovoltaic body 12, as is well known to those of skill in the art, operates to absorb incident photons and to generate electron-hole pairs in response thereto, and to separate the members of these pairs and direct them to the respective electrodes 10,14 of the cell. There are a great variety of photovoltaic materials known to those of skill in the art and the present invention is not limited to any one such material. Among some of the preferred materials are the thin film materials such as the fluorinated silicon and germanium alloys referred to hereinabove as well as cadmium telluride, gallium arsenide, copper indium diselenide, single crystal silicon, and the like. In one particularly preferred construction, the photovoltaic body comprises at least one triad of silicon alloy material which includes a layer of intrinsic material 12a interposed between N-type 12b and P-type 12c alloy materials. In one preferred embodiment, at least, one of the N-type 12b and P-type layers 12c is a microcrystalline layer, preferably the layer proximate the light incident side of the photovoltaic device. In some instances, a number of triads of N-I-P (or P-I-N) type materials are stacked one atop another to provide for enhanced efficiency and sensitivity.

The top electrode layer 14, as noted hereinabove, is preferably a transparent body and there are available a number of highly degenerate semiconductors such as indium tin oxide and the like which may be employed as top electrode layers. The grid line 16 is preferably fabricated from an electrically-conductive ink or paste or it may be a metallic body adhered to the top electrode layer. In some instances, the grid line 16 is placed beneath or embedded within the top electrode layer 14. For this reason, and within the context of the present invention, the grid line 16 is described as being electrically associated with the top electrode layer 14. The layer of encapsulant material 18 protects the components of the photovoltaic cell from the ambient environment and from mechanical damage. The encapsulant layer 18 is preferably fabricated from a material which is highly transparent and inert. Organic polymers comprise the most preferred materials for this layer and ethylene vinyl acetate (EVA) is one particularly preferred material. Cross-linkable ethylene vinyl acetate having particular utility in the present invention is sold by the Du Pont de Nemours, E.I. & Company. Other preferred materials include fluorocarbon polymers, polyurethane, polystyrene, polyvinyl acetate, as well as various silicon compounds. In some instances, a bi-layered structure of fluoropolymer/EVA is employed.

FIG. 1 illustrates the manner in which prior art photovoltaic cells suffered from problems of grid line shading. As will be noted, a photon flux 20 is shown as incident upon the device. Those photons which strike the grid line 16 are absorbed, or in some instances reflected, and hence not available to penetrate the photovoltaic body and generate charge carriers. These photons effectively represent a loss in the efficiency of the cell.

Figure 2:
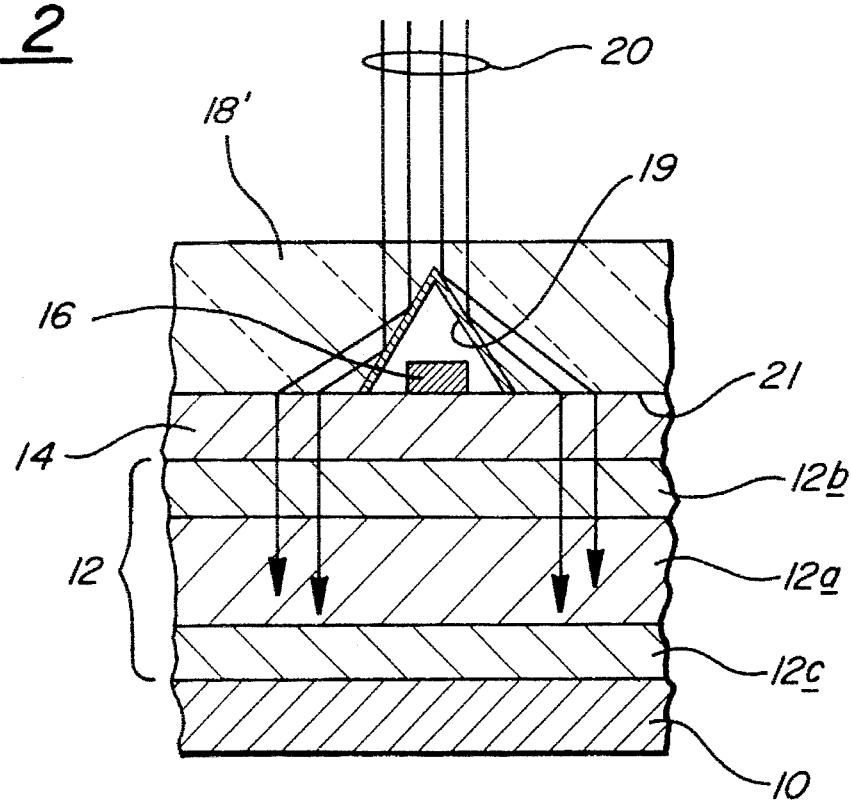
FIG. 2 is a cross sectional of a portion of a photovoltaic cell configured in accordance with the principles of the present invention and illustrating the manner in which the present invention operates to minimize grid line shading.

Referring now to FIG. 2, there is shown a photovoltaic device generally similar to that of FIG. 1, but including the improvement of the present invention which comprises a transparent encapsulant cover 18' configured to include an integral optical element in a form of a groove disposed in the region of the grid line 16. The particularly configured transparent encapsulant cover 18' operates to reflect incident light 20 away from the gridline 16 and into the photovoltaic body 12. In this manner, shading losses occasion by the presence of the grid lines 16 are minimized. As a consequence, grid lines may be made wider and hence longer and the cell size may be greatly increased.

Preferably, the groove formed in encapsulant cover 18' is V-shaped and includes two angled side walls 19 which, preferably, have a reflective surface such as a silvered coating. As can be seen in FIG. 2, the side walls 19 extend from a bottom surface 21 of encapsulant cover 18' and through a portion of the cover, itself. The bottom surface 21 of cover 19 is grooved such that the grooves are in registry with, and overlie, the grid lines 16 which are disposed on the top surface of the top electrode 14. Thus, the side walls 19 form a "tent like" structure over each grid line 16.

Figure 4:
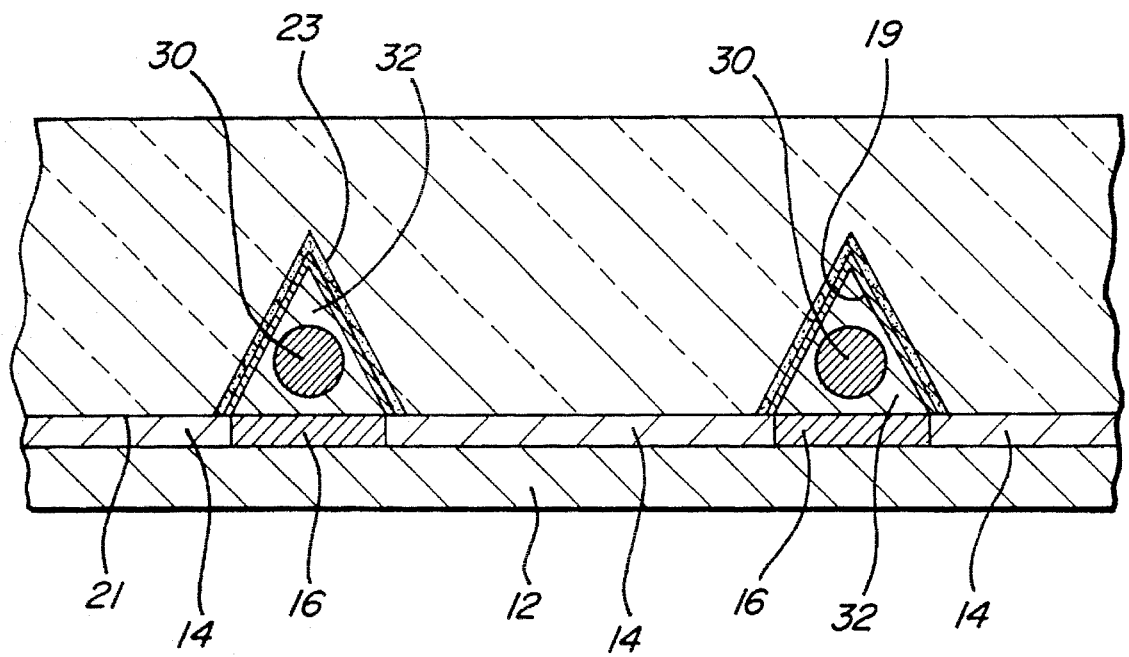
FIG. 4 is a cross-sectional view of a photovoltaic cell illustrating yet another configuration of a light directing element structured in accordance with the present invention.

By providing a reflective coating on each side wall 19, the medium within the groove does not have to have a lower refractive index than the encapsulating material, as is the case with all known prior art, grooved structures. Thus, the groove may be filled with a conductive material, such as a carbon paste or the like, as is shown in the embodiment depicted in FIG. 4. FIG. 4 shows a mass of carbon paste 32 disposed inside each groove, the side walls 19 of which further include reflective coating 23. In this embodiment, a conductive wire 30 is disposed in each groove and is surrounded and supported by the conductive carbon paste 32. Thus, each conductive wire 30 is in electrical communication with the grid line 16 which it overlies, resulting in a current collecting network of much lower electrical resistance and much greater efficiency. However, because each grid line 16, conductive wire 30, and mass of carbon paste 32 are covered by reflective coated side walls 19, the increased size of the current collecting network inherent in the embodiment shown in FIG. 4 does not result in lower efficiency due to shading; rather, the incident light thereon is reflected away to adjacent portions of the cell in the manner shown in FIG. 2.

Figure 3:
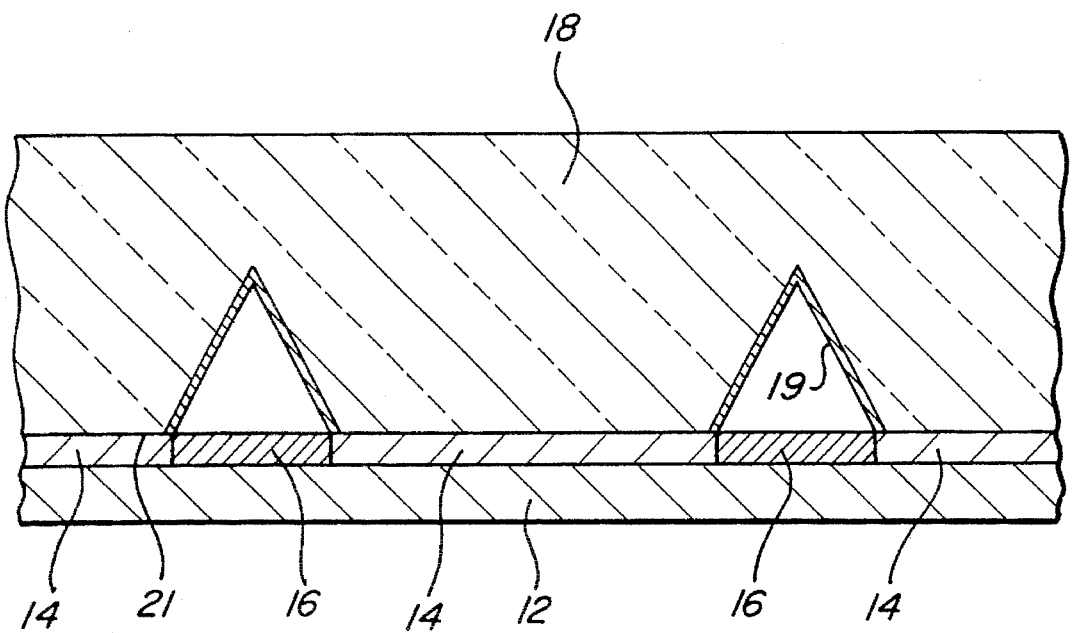
FIG. 3 is a cross-sectional view of a portion of a photovoltaic cell illustrating another configuration of a light directing element structured in accordance with the present invention.

Of course, the light directing element of the present invention may also be used to cover a more conventional solar cell, as is shown in FIG. 3. Like FIG. 4, the side walls 19 of the grooves have a reflective coating.

In a particularly preferred method of manufacture of the light directing element of the present invention, the cover is first fabricated and grooved, as previously described. After the grooving step, a silvered layer is coated onto the entire bottom surface of the cover, including the side walls of the grooves and the lands in between the side walls. Then, the coating on the lands between the grooves is removed by abrasion or chemical processes, thus leaving the reflective coating on the side walls of the grooves. Obviously, it is important not to leave the coating on the lands since this would cause incident light to be reflected back from the solar cell, a highly undesirable result. After the reflective coating is removed from the lands, an adhesive is applied to one of the top surface of the top electrode of the photovoltaic cell or the bottom surface of the encapsulant cover, or both. The cover is then fitted onto the solar cell so that the grooves are in registry with the underlying grid lines, and the adhesive is allowed to set. Optionally, after the step of removing the coating from the lands, the grooves may be filled with conductive carbon paste, and wires formed of, for example, copper or silver may be embedded in the paste. The cover is then cemented to the cell as described above.

The particular angle and width of a groove will depend upon the thickness of the underlying layer and the width of the grid line. Calculation of groove configuration may be readily undertaken by one of skill in the art employing basic principles of optics. Clearly, configurations other than those shown herein will be readily apparent to one of skill in the art in view of the drawings, discussion and description which are included herein. The foregoing are illustrative of particular embodiments of the present invention and are not limitations upon the practice thereof. It is the following claims, including all equivalents, which define the scope of the invention.

I claim:

1. A photovoltaic cell having decreased shading, comprising:

a layer of bottom electrode material;

a photovoltaic body disposed on said layer of bottom electrode material;

a transparent layer of top electrode material disposed upon said photovoltaic body in a spaced apart relationship with said layer of bottom electrode material so that the photovoltaic body is sandwiched therebetween;

at least one electrically conductive current-collecting grid line formed by at least one current conducting wire in electrical communication with said top electrode;

an encapsulant cover of transparent, electrically insulating synthetic organic polymeric material disposed directly upon said top electrode material and said at least one wire so as to cover the top electrode and the at least one wire; and a V-shaped groove formed in said encapsulant cover at an interface with said top electrode and extending for a distance through said encapsulant cover, said wire being disposed in said groove such that said groove is generally coextensive with the length of said current collecting wire and in registry therewith, said groove including two angularly disposed, silvered side walls which are operative to reflect incident light away from the grid line so that said light illuminates adjacent portions of said photovoltaic cell, and further comprising a mass of electrically conductive filler material disposed in said groove and supporting said wire to place said wire in electrical communication with said top electrode.

2. The cell of claim 1 further including a plurality of grid lines and a plurality of grooves in registry therewith.

3. A method of manufacturing a photovoltaic device having decreased shading of incident illumination from collector grid lines, said method comprising the steps of:

providing a photovoltaic cell, said cell including a bottom electrode layer, a photovoltaic body disposed atop the bottom electrode layer, a transparent top electrode layer disposed atop the photovoltaic body, and an electrically-conductive current-collecting grid line in electrical communication with said top electrode layer;

forming a cover of transparent, organic, polymeric, encapsulating material, said cover being configured to cover the top electrode layer and grid line;

forming a V-shaped groove in a bottom surface of said cover, said groove extending upward into said cover and including two angularly disposed side walls;

depositing an electrically conductive filler material in said groove; and attaching said cover onto said cell such that said groove is in registry with said grid line.

4. The method of claim 3 comprising the further step of coating said grooved, bottom surface of said cover with a silvered, reflective coating.

5. The method of claim 4 further comprising the step of removing said reflective coating from said bottom surface while leaving said coating on said side walls.

6. The method of claim 3 wherein the step of attaching the cover onto the cell comprises the further steps of applying adhesive to one of said cover and said top electrode, fitting said cover onto said cell such that said groove is in registry with said grid line, and allowing said adhesive to set to encapsulate said cell.

7. A method of manufacturing a photovoltaic device having decreased shading of incident illumination from collector grid lines, said method comprising the steps of:

providing a photovoltaic cell comprising a photovoltaic body, said cell including a bottom electrode layer, a top electrode layer disposed atop the photovoltaic body, and an electrically-conductive current-collecting grid line in electrical communication with said top electrode layer;

forming a cover of transparent, organic, polymeric, encapsulating material, said cover being configured to cover the top electrode layer and grid line;

forming a V-shaped groove in a bottom surface of said cover, said groove extending upward into said cover and including two angularly disposed side walls;

disposing a current conducting wire in said groove, said current conductive wire serving as said grid line;

depositing an electrically conductive filler material in said groove to surround and support said wire; and attaching said cover onto said cell such that said groove is in registry with said cover.

8. The method of claim 7 wherein the step of attaching the cover onto the cell comprises the further steps of applying adhesive to one of said cover and said top electrode, fitting said cover onto said cell such that said groove is in registry with said grid line, and allowing said adhesive to set to encapsulate said cell.

\* \* \* \* \*